(12) United States Patent
Hu et al.

(10) Patent No.: US 10,294,561 B2
(45) Date of Patent: *May 21, 2019

(54) GROWTH OF METAL ON A DIELECTRIC

(71) Applicant: INTERNATIONAL BUSINESS MACHINES CORPORATION, Armonk, NY (US)

(72) Inventors: Guohan Hu, Yorktown Heights, NY (US); Daniel C. Worledge, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/911,950

(22) Filed: Mar. 5, 2018

(65) Prior Publication Data

US 2018/0195168 A1 Jul. 12, 2018

Related U.S. Application Data

(63) Continuation of application No. 14/958,052, filed on Dec. 3, 2015, now Pat. No. 9,963,780.

(51) Int. Cl.
*C23C 16/06* (2006.01)
*C23C 14/02* (2006.01)
*C23C 14/14* (2006.01)
*C23C 16/02* (2006.01)
*C23C 18/16* (2006.01)
*C23C 18/50* (2006.01)
*C23C 18/31* (2006.01)

(52) U.S. Cl.
CPC ............ *C23C 16/06* (2013.01); *C23C 14/024* (2013.01); *C23C 14/14* (2013.01); *C23C 16/0272* (2013.01); *C23C 18/1689* (2013.01); *C23C 18/1692* (2013.01); *C23C 18/31* (2013.01); *C23C 18/50* (2013.01)

(58) Field of Classification Search
None
See application file for complete search history.

(56) References Cited

U.S. PATENT DOCUMENTS

| | | | | |
|---|---|---|---|---|
| 6,022,808 A * | 2/2000 | Nogami | ............ | H01L 21/76877 216/17 |
| 6,037,257 A * | 3/2000 | Chiang | ................ | C23C 14/024 257/762 |
| 8,164,862 B2 * | 4/2012 | Zhang | .................... | B82Y 10/00 360/324.1 |
| 8,722,543 B2 * | 5/2014 | Belen | ...................... | H01L 43/12 257/295 |
| 2014/0070344 A1 * | 3/2014 | Khalili Amiri | ......... | H01L 43/08 257/421 |

OTHER PUBLICATIONS

List of IBM Patents or Patent Applications Treated as Related dated Mar. 5, 2018, 2 pages.

* cited by examiner

*Primary Examiner* — Robert S Loewe
(74) *Attorney, Agent, or Firm* — Tutunjian & Bitetto, P.C.; Vazken Alexanian

(57) ABSTRACT

A method for forming metal on a dielectric includes forming a seed layer on a surface including a reactant element. A first metal layer is formed on the seed layer wherein the first metal layer wets the seed layer. A second metal layer is formed on the first metal layer wherein the second metal layer wets the first metal layer. Diffuse the reactant element of the seed layer into the first metal layer by annealing to convert the first metal layer to a dielectric layer.

20 Claims, 3 Drawing Sheets

GROWTH OF METAL ON A DIELECTRIC

BACKGROUND

Technical Field

The present invention relates to integrated circuit processing, and more particularly to methods for growing a metal on a dielectric material with reduced or eliminated agglomeration.

Description of the Related Art

Growing a thin film of metal on top of a dielectric is challenging, since the metal does not wet a surface of the dielectric, and instead balls up into small agglomerations. This makes the film rough (or perhaps even discontinuous), and hence unusable.

In a magnetic tunnel junction, one magnetic metal layer must be grown on top of an oxide tunnel barrier, such as a top CoFeB layer in a CoFeB/MgO/CoFeB structure. In another example, for magnetic tunnel junctions used in spin torque magnetoresistive random access memory (MRAM), a free layer needs to be sandwiched in between an oxide cap and an oxide seed layer, for example, a free layer (CoFeB) is sandwiched between MgO layers (e.g., oxide seed layer (MgO)/free layer (CoFeB)/oxide cap layer (MgO)/CoFeB). Other examples and applications in thin film technology outside of MRAM devices also suffer from similar constraints when forming metal on dielectric.

SUMMARY

A method for forming metal on a dielectric includes forming a seed layer on a surface including a reactant element. A first metal layer is formed on the seed layer wherein the first metal layer wets the seed layer. A second metal layer is formed on the first metal layer wherein the second metal layer wets the first metal layer. The reactant element of the seed layer is diffused into the first metal layer by annealing to convert the first metal layer to a dielectric layer.

Another method for forming metal on a dielectric includes forming a seed layer on a surface; forming a first metal layer on the seed layer wherein the first metal layer wets the seed layer; forming a second metal layer on the first metal layer wherein the second metal layer wets the first metal layer; reacting the second metal layer with a reactant element; and annealing to diffuse the reactant element of the second metal layer into the first metal layer to convert the first metal layer to a dielectric layer.

A structure having a metal on a dielectric includes a seed layer formed on a surface. A first dielectric layer includes a metal and is formed on the seed layer wherein the first dielectric layer includes a wetted interface with the seed layer. A metal layer is formed on the first dielectric layer wherein the second metal layer includes a wetted interface with the first dielectric layer, and wherein the metal in the dielectric layer includes an affinity for a reactant element, included in the first dielectric layer, that is higher than an adjacent layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
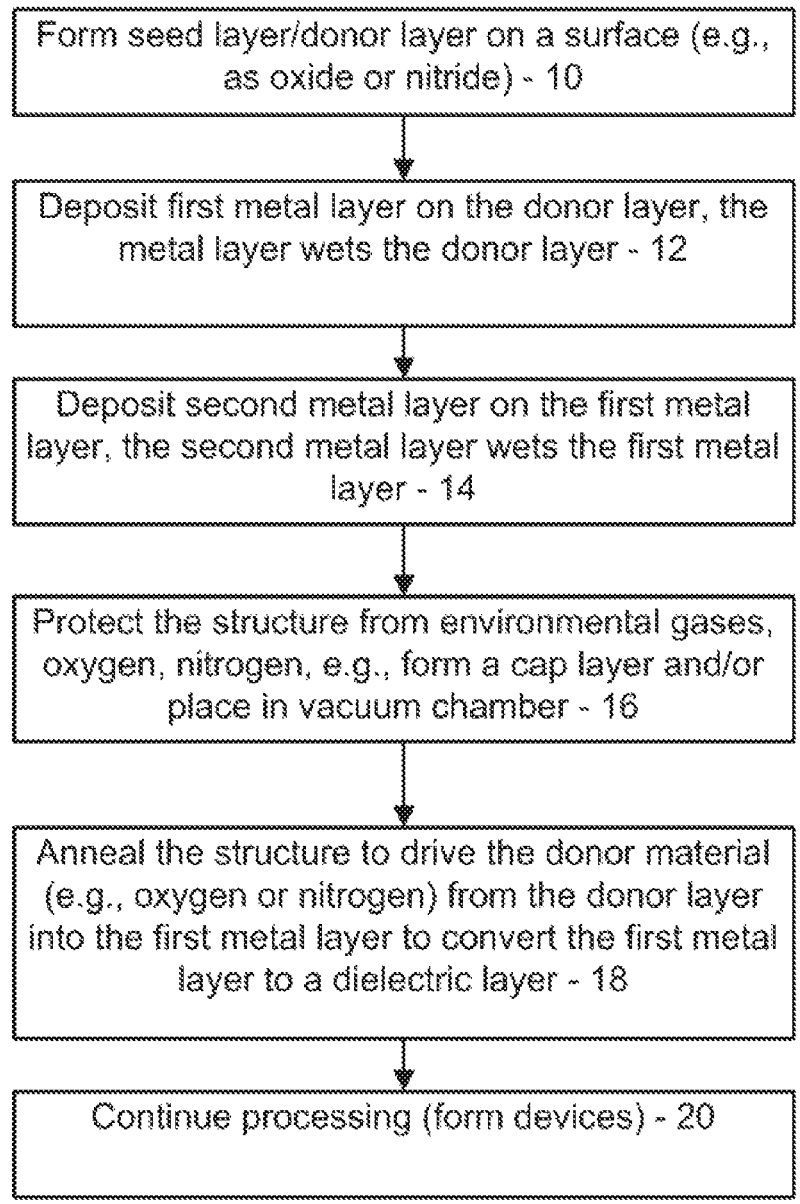
FIG. 1 is a block/flow diagram showing a method forming a metal on a dielectric by transforming a metal layer into a dielectric layer in accordance with one illustrative embodiment.

In accordance with the present principles, methods and devices are described for growing smooth continuous films of metal on dielectric. Oxygen or nitrogen in dielectric layers is mobile. In useful embodiments, deposition processes are altered so that the metal can be grown on a metal surface instead of an oxide or nitride surface. In one embodiment, an example of growing CoFeB on MgO is employed. For example, a multi-layered structure may include: Ta/MgO/CoFeB/cap, where the layer grown first is on the left and the layer grown last is on the right. While the present principles are useful for fabricating magnetic devices, such as magnetic memory devices, and in particular Ta/MgO/CoFeB/cap structures, the present principles should not be construed as limited to these arrangements, these materials, or these uses. The present principles are broadly applicable to the growth of a metal on a dielectric.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for magnetic devices, thin film deposition on objects, integrated circuit chips, etc. Such devices, object, chips, etc. may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of magnetic devices, thin film deposition on objects, integrated circuit chips, etc. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., CoFeB, RuOx, etc., where small x represents a % or fraction. These compounds include different proportions of the elements within the compound. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring now to the drawings in which like numerals represent the same or similar elements and initially to FIG. 1, a block/flow diagram shows a method for forming a metal on a dielectric in accordance with one illustrative embodiment. In block 10, a seed layer with a reactant element (e.g., oxygen or nitrogen) is formed on a substrate or surface. The oxide or nitride donor layer preferably includes a metal or other material that permits wetting of materials to be formed on this donor layer. The donor layer may also be referred to as a seed layer. The seed layer may be formed by any suitable process on the substrate. The process may include chemical vapor deposition, evaporation, electroless deposition, etc.

The seed layer may include material such as, e.g., RuOx, TaOx, ErOx, ScOx, TiNx, TaNx or any other seed layer material that can donate oxygen, nitrogen or any other element that can diffuse into an adjacent metal layer to form a dielectric. The seed layer preferably includes a metal or other material to promote wetting of a next layer to be deposited. Wetting of the next layer ensures that gaps and interstices are removed to permit the diffusion of the donor elements.

In block 12, a first metal layer is deposited on the donor/seed layer. The metal layer wets the donor layer based upon the material choice and the deposition process for the first metal layer. Wetting can be achieved with appropriate temperature to ensure layer cohesion. The first metal layer needs to form a dielectric with the donor elements from the donor/seed layer. The first metal layer preferably includes a metal that has an affinity for reacting with the donor elements, and the affinity of the first metal layer should be greater than the metal in the seed or donor layer. The first metal layer may include Mg, Mn, Hf, Zr, or other materials.

In block 14, a second metal layer is deposited on the first metal layer, the second metal layer wets the first metal layer. The second metal layer may include Fe, Co, FeCoB, W, Ag, Au, Pt, Pd, alloys of these and other metals, etc.

In block 16, the multilayer structure may be protected from environmental gases, e.g., oxygen, nitrogen, etc. This may be achieved by placing the multi-layered structure in a vacuum chamber for processing. In other embodiments, a cap layer of sufficient thickness may be formed to prevent diffusion of reactants into the multi-layer structure. The cap layer may include any suitable material or materials, such as e.g., SiN, $SiO_2$, MgO, etc.

In block 18, an anneal process is performed on the structure to drive the donor material or reactant element (e.g., oxygen or nitrogen) from the seed/donor layer into the first metal layer to convert the first metal layer to a dielectric layer. The anneal process may include subjecting the multi-layered structure to a temperature of between about 300 degrees C. to about 800 degrees C. for between 100 seconds to about 60 minutes. The anneal can be performed with or without the cap layer being formed.

In block 20, processing continues, e.g., to form devices. Continued processing may include removing or adjusting the cap layer and patterning the second layer, patterning the newly formed dielectric layer below the second metal layer, forming devices, etc.

Figure 2:
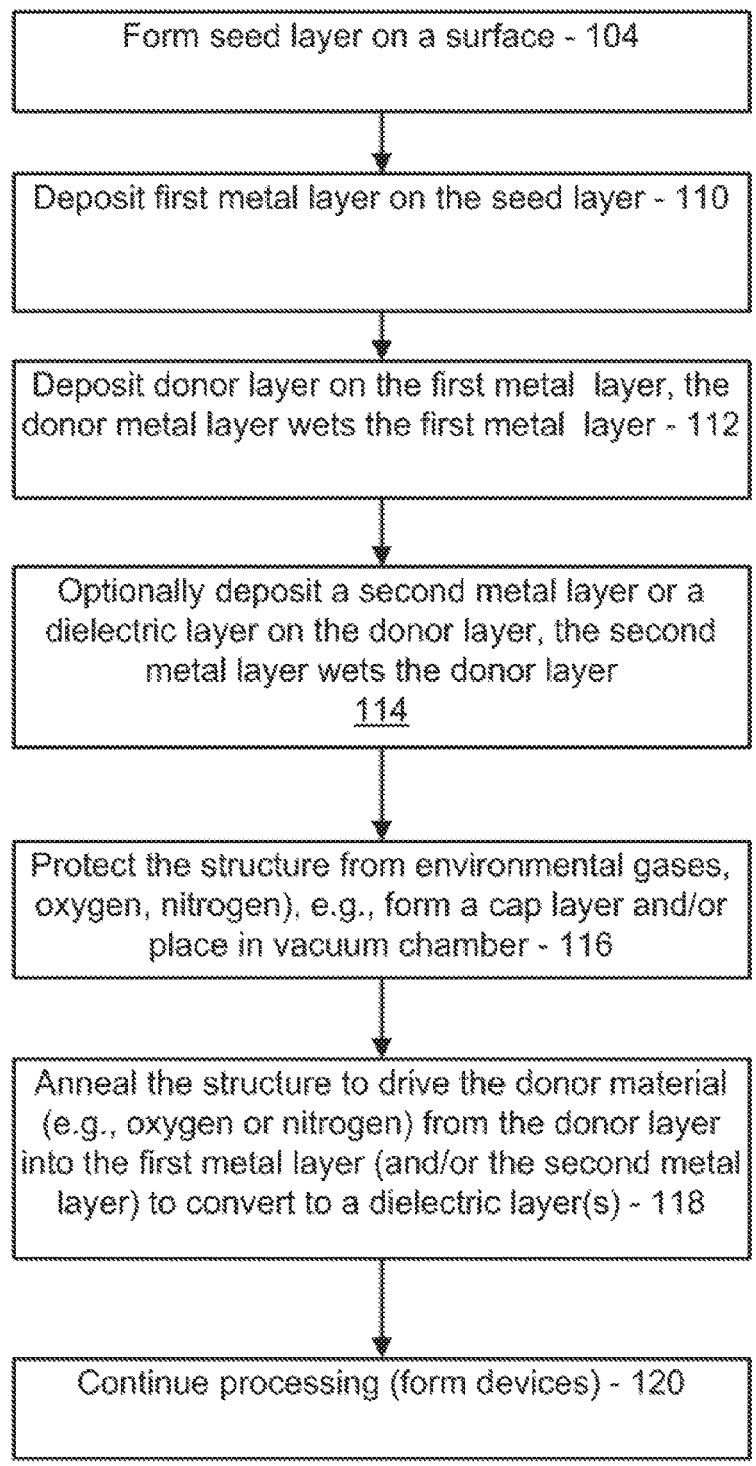
FIG. 2 is a block/flow diagram showing another method of forming a metal on a dielectric by transforming one or two metal layers into a dielectric layer or dielectric layers in accordance with another illustrative embodiment.

Referring to FIG. 2, a block/flow diagram shows another method for forming a metal on a dielectric in accordance with one illustrative embodiment. In block 104, a seed layer is formed on a substrate or surface. The seed layer preferably includes a metal or other material that permits wetting of materials to be formed on this layer. The seed layer may be formed by any suitable process on the substrate. The process may include chemical vapor deposition, evaporation, electroless deposition, etc. The seed layer preferably includes a metal, such as, e.g., Ta or Ti although other materials may be employed.

In block 110, a first metal layer is formed on the seed layer. The first metal layer preferably includes a metal or other material that permits wetting of materials to be formed on this layer. The metal layer may be formed by any suitable process on the substrate including chemical vapor deposition, evaporation, sputtering, electroless deposition, etc.

The first metal layer needs to form a dielectric with donor elements from a donor layer to be formed. The first metal layer preferably includes a metal that has an affinity for reacting with the donor elements, and the affinity of the first metal layer should be greater than the metal in the donor layer. The first metal layer may include Mg, Mn, Hf, Zr, or other materials.

In block 112, a donor layer is deposited on the first metal layer. The donor layer includes metal or other material and wets the first metal layer based upon the material choice and the deposition process for the first metal layer. Wetting can be achieved with appropriate temperature to ensure layer cohesion. The donor layer may include oxides or nitrides of Fe, Co, FeCo, FeCoX, where X can be any element, and/or alloys of these and other metal oxides or nitrides.

In block 114, a second metal layer may optionally be deposited on the donor layer; the second metal layer would also wet the donor layer. The second metal layer may include Mg, Mn, Hf, Zr, or other materials. The first and the second metal layers in this embodiment may be the same material.

The second metal layer is provided to be converted into a dielectric layer along with the first metal layer. Alternately, a dielectric layer may be formed on the donor layer directly so a conversion or transformation of this layer is not needed. The dielectric layer may be formed instead of or in addition to the second metal layer. The dielectric layer may include MgO, although other materials may be employed.

In block 116, the multilayer structure may be protected from environmental gases, e.g., oxygen, nitrogen, etc. This may be achieved by placing the multi-layered structure in a vacuum chamber for processing. In other embodiments, a cap layer of sufficient thickness may be formed to prevent diffusion of reactants into the multi-layer structure. The cap layer may include any suitable material or materials, such as e.g., SiN, SiOx, etc.

In block 118, an anneal process is performed on the structure to drive the donor material (e.g., oxygen or nitrogen) from the donor layer into the first metal layer and/or the second metal layer to convert the first and/or second metal layer to a dielectric material(s). The anneal process may include subjecting the multi-layered structure to a temperature of between about 300 degrees C. to about 800 degrees C. for between 10 seconds to about 60 minutes. The anneal process converts the first and/or second metal layers to dielectric layers and the donor layer becomes a conductive layer (e.g., the metal layer). The anneal can be performed with or without the cap layer being formed.

In block 120, processing continues. Continued processing may include removing the cap layer, patterning the layers, forming devices, etc.

Figure 3:
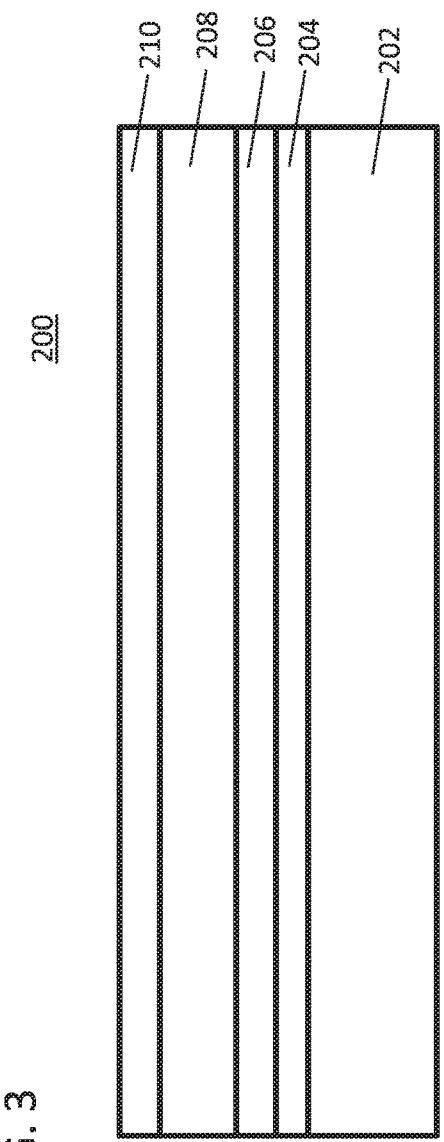
FIG. 3 is a cross-sectional view of a multi-layered structure showing a metal layer formed on a dielectric layer in accordance with the present principles.

Referring to FIG. 3, an example structure 200 is shown in accordance with one embodiment. A seed layer 204 is formed on a substrate 202. The substrate 202 may include any suitable material including a metal, semiconductor, glass, quartz, plastic, etc. The seed layer 204 may include Ta seeds grown with oxygen (either as TaOx or as Ta metal followed by oxidation). Other seed materials may also be employed. A first metal layer 206 is deposited. The metal layer 206 may include Mg metal, which is grown on the TaOx of the seed layer 204. The Mg of layer 206 wets the surface of TaOx seed layer 204. In many cases, the application permits a choice of material employed as the seed layer 204 (in place of Ta) to select a material whose oxide is wet by Mg or other metal of layer 206.

A second metal layer 208 is formed on the first metal layer 206. The second metal layer 208 may include, e.g., CoFeB or other material, which is grown on the Mg metal of layer 206. The second metal layer 208 wets the first metal layer 206. The structure 200 is annealed either before or after a cap layer 210 is grown. The anneal can be performed in vacuum, if needed (not needed if the cap layer 210 is thick enough to prevent air from diffusing in). The anneal drives the oxygen (or nitrogen) from the seed layer 204 into the first metal layer 206. In the example, oxygen from the TaOx diffuses into the Mg to form MgO in layer 206. The affinity of Mg for oxygen needs to be higher than the affinity of Ta for oxygen. Hence, the structure 200 goes from TaOx/Mg/CoFeB/cap, which is then transformed after annealing into Ta/MgO/CoFeB/cap. This results in a metal (CoFeB) on a dielectric (MgO).

Figure 4:
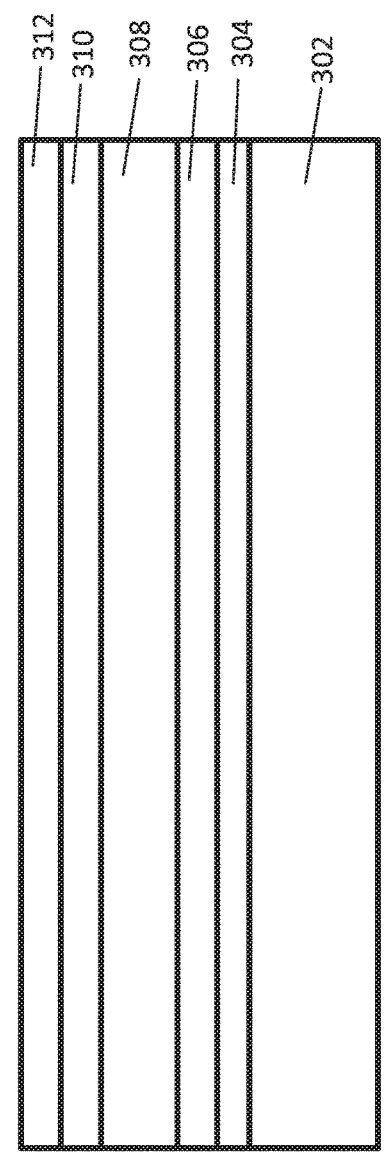
FIG. 4 is a cross-sectional view of another multi-layered structure showing one or two dielectric layers formed adjacent to a metal layer in accordance with the present principles.

Referring to FIG. 4, in other embodiments, donor layers may be formed adjacent to metal layers and annealed to cause the adjacent metal layers to become dielectric. In one embodiment, a structure 300 includes a seed layer 304 formed on a substrate 302. The substrate 302 may include any suitable material including a metal, semiconductor, glass, quartz, plastic, etc. The seed layer 304 may include Ta seeds, although other materials may be employed. A first metal layer 306 is deposited. The metal layer 306 may include Mg metal, which is grown on the Ta of the seed layer 304. The Mg of layer 306 wets the surface of the Ta seed layer 304. In many cases, the application permits a choice of material employed as the seed layer 304 (in place of Ta) to select a material (e.g., metal), which is wet by Mg or other metal.

A donor layer 308 is formed on the first metal layer 306. The donor layer 208 may include CoFeB or other material, which is grown on the Mg metal of layer 306. The donor layer 308 wets the first metal layer 306. The donor layer is oxidized to form CoFeBOx.

A second metal layer 310 may optionally be deposited on the donor layer 308. The metal layer 310 may include Mg metal, which is grown on the CoFeBOx or other material of donor layer 308. The Mg of layer 310 wets the surface of the CoFeBOx of the donor layer 304.

The structure 300 is annealed either before or after a cap layer 310 is grown. The anneal can be performed in vacuum, if needed (not needed if the cap layer 310 is thick enough to prevent air from diffusing in). The anneal drives the oxygen (or nitrogen) of the donor layer 308 into the first metal layer 306 (and the second metal layer 310, if present). In the example, oxygen from the CoFeBOx diffuses into the Mg to form MgO in layer 306 (and layer 310). The affinity of Mg for oxygen needs to be higher than the affinity of CoFeB for oxygen.

Metal layers are converted from Ta/Mg/CoFeB, followed by oxidation to form Ta/Mg/CoFeBOx. After annealing, the oxygen from CoFeBOx diffuses into the Mg to form MgO. The affinity of Mg for oxygen is higher than the affinity of CoFeB for oxygen; hence, the structure 300 goes from Ta/Mg/CoFeBOx/cap, to Ta/MgO/CoFeB/cap. This results in a metal (CoFeB) on a dielectric (MgO).

In another embodiment, structure 300 may include seed/Mg/CoFeX, followed by oxidation to form seed/Mg/CoFeXOx, where X represents any element (or no element in the case of pure CoFe). Then, MgO is grown as an oxide layer 310 on the CoFeXOx of layer 308 followed by an optional cap 310 to form seed/Mg/CoFeXOx/MgO/cap. The sample is then annealed, in vacuum if needed (unless the cap 310 is thick enough to prevent air from diffusing in), to drive the oxygen from the CoFeXOx on layer 308 into the Mg of layer 306 to form MgO.

In another embodiment, two metal layers are employed (layers 306 and 310). The structure 300 includes seed/MgO/CoFeX/MgO/cap where X represents any element (or no element in the case of pure CoFe). In this case, there is another option for how the top MgO of layer 310 is grown. The structure 300 may be grown as seed/Mg/CoFeX, followed by oxidation to form seed/Mg/CoFeXOx. Then, Mg metal is grown (followed by an optional cap) to form seed/Mg/CoFeXOx/Mg/cap. The structure 300 is then annealed in vacuum if necessary (unless the cap 312 is thick enough to prevent air from diffusing in) to drive the oxygen from the CoFeXOx (layer 308) into both of the Mg layers 306 and 310 to turn both of them into MgO. The resulting structure is seed/MgO/CoFeX/MgO/cap.

The structures of FIGS. 3 and 4 may be employed in magnetic tunnel junction devices including use in spin torque magnetoresistive random access memory (MRAM). The layers structure sin FIGS. 3 and 4 may be patterned to form magnetic device stacks and further processed to form memory cells. The present principles may also be applied to other devices and structures, and employ other materials as described.

Having described preferred embodiments for growth of metal on a dielectric (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method comprising:
    forming a first metal layer on a seed layer, wherein the first metal layer wets the seed layer; and
    annealing to diffuse a reactant element of the seed layer into the first metal layer to convert the first metal layer to a dielectric layer.

2. The method as recited in claim 1, further comprising forming the seed layer on a surface.

3. The method as recited in claim 1, wherein the reactant element has a greater affinity for the first metal layer than the seed layer.

4. The method as recited in claim 1, wherein the seed layer includes a metal oxide and the reactant element includes oxygen.

5. The method as recited in claim 1, wherein the seed layer includes a metal nitride and the reactant element includes nitrogen.

6. The method as recited in claim 1, wherein the first metal layer includes Mg and the dielectric layer includes MgO.

7. The method as recited in claim 1, further comprising forming a second metal layer on the first metal layer, wherein the second metal layer wets the first metal layer.

8. The method as recited in claim 7, further comprising forming a cap on the second metal layer.

9. The method as recited in claim 7, wherein the second metal layer includes FeCo or an alloy thereof.

10. A method comprising:
    forming a second metal layer on a first metal layer, wherein the second metal layer wets the first metal layer;
    reacting the second metal layer with a reactant element; and
    annealing to diffuse the reactant element of the second metal layer into at least the first metal layer to convert the first metal layer to a first dielectric layer.

11. The method as recited in claim 10, further comprising forming the first metal layer on a seed layer, wherein the first metal layer wets the seed layer.

12. The method as recited in claim 11, further comprising forming the seed layer on a surface.

13. The method as recited in claim 10, wherein the reactant element includes one of oxygen or nitrogen.

14. The method as recited in claim 10, wherein the first metal layer includes Mg and the dielectric layer includes MgO.

15. The method as recited in claim 10, wherein the reactant element has a greater affinity for the first metal layer than the second metal layer.

16. The method as recited in claim 10, wherein the second metal layer includes FeCo or an alloy thereof.

17. The method as recited in claim 10, further comprising forming a dielectric layer on the second metal layer.

18. The method as recited in claim 10, further comprising forming a cap on the second metal layer.

19. The method as recited in claim 10, further comprising forming a third metal layer on the second metal layer, wherein the annealing further diffuses the reactant element of the second metal layer is into the third metal layer to convert the third metal layer to a second dielectric layer.

20. The method as recited in claim 19, wherein the third metal layer includes Mg and the third dielectric layer includes MgO.

* * * * *